United States Patent
Seitz et al.

(10) Patent No.: US 7,105,404 B2
(45) Date of Patent: Sep. 12, 2006

(54) METHOD FOR FABRICATING A SEMICONDUCTOR STRUCTURE

(75) Inventors: Mihel Seitz, Radebeul (DE); Stephan Wege, Weissig (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 11/071,532

(22) Filed: Mar. 4, 2005

(65) Prior Publication Data

US 2005/0202626 A1    Sep. 15, 2005

(30) Foreign Application Priority Data

Mar. 12, 2004  (DE) .................. 10 2004 012 280

(51) Int. Cl.
*H01L 21/8242* (2006.01)
(52) U.S. Cl. ...................................... 438/243; 438/386
(58) Field of Classification Search ........ 438/243–249, 438/386–392
See application file for complete search history.

(56) References Cited

U.S. PATENT DOCUMENTS

| 6,235,214 B1 * | 5/2001 | Deshmukh et al. ........... 216/67 |
| 2001/0055664 A1 | 12/2001 | Engelhardt et al. |
| 2003/0139052 A1 | 7/2003 | Tsai et al. |
| 2004/0005516 A1 | 1/2004 | Chen |

FOREIGN PATENT DOCUMENTS

| EP | 0928018 A2 | 7/1999 |
| EP | 0942461 A2 | 9/1999 |

* cited by examiner

*Primary Examiner*—H. Jey Tsai
(74) *Attorney, Agent, or Firm*—Morrison & Foerster LLP

(57) ABSTRACT

The present invention provides a method for fabricating a semiconductor structure having the steps of: providing a semiconductor substrate (1) made of silicon with a first hard mask layer (10; 10') made of silicon oxide and an overlying second hard mask layer (15; 15') made of silicon; providing a masking layer (30; 30') made of silicon oxide above and laterally with respect to the second hard mask layer (15; 15') made of silicon and above an uncovered edge region (RB) of the semiconductor substrate (1); providing a photoresist mask (25) above the masking layer (30; 30') with openings corresponding from trenches (DT) to be formed in the semiconductor substrate (1); opening the masking layer (30; 30') in a first plasma process using the photoresist mask (25), the edge region (RB) being covered by a shielding device (AR); opening the first hard mask layer (10; 10') and second hard mask layer (15; 15') in a second and third plasma process; and forming the trenches (DT) in the semiconductor substrate (1) in a fourth plasma process using the opened first hard mask layer (10; 10'); the edge region (RB) not being covered by the shielding device (AR) in the second to fourth plasma processes.

8 Claims, 3 Drawing Sheets

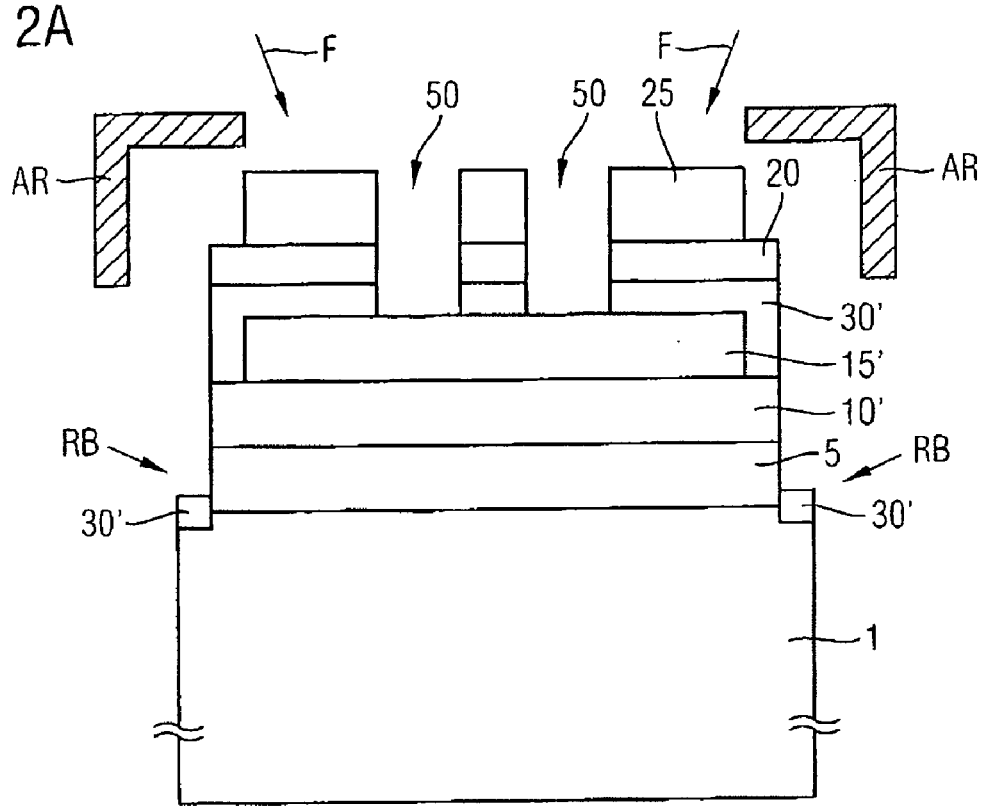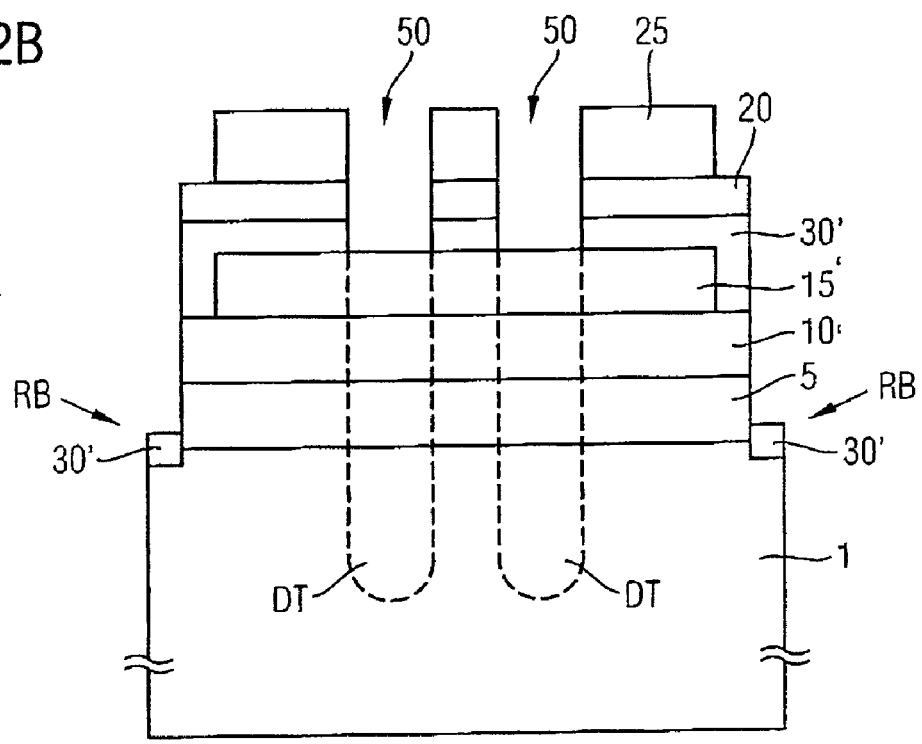

METHOD FOR FABRICATING A SEMICONDUCTOR STRUCTURE

CLAIM FOR PRIORITY

This application claims priority to German Application No. 10 2004 012 280.6 filed Mar. 12, 2004, which is incorporated herein, in its entirety, by reference.

The present invention relates to a method for fabricating a semiconductor structure.

Although applicable to arbitrary semiconductor structures in which trenches are etched by means of a hard mask, the present invention and also the problem area on which it is based are explained with regard to capacitor trenches (so-called "deep trenches") for a semiconductor memory device.

Generally, the capacitor trenches are fabricated by means of a plasma etching into a crystalline silicon semiconductor substrate. During this plasma etching so-called "black silicon" may form as a result of an incomplete coverage of the edge region of the wafer by the hard mask required for plasma etching. Moreover, a mask erosion takes place at the edge.

Figure 3:
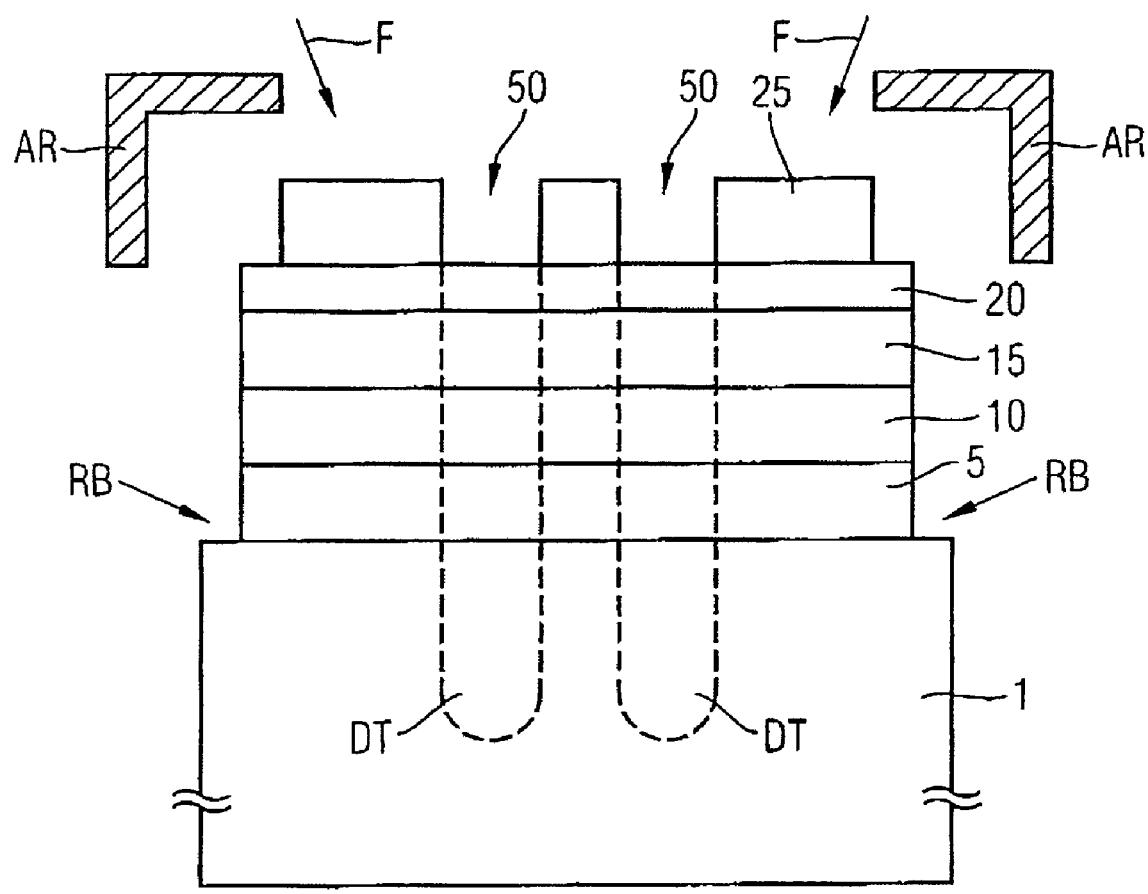

FIG. 3 is a schematic illustration of an exemplary fabrication method for elucidating the problem area, on which the present invention is based.

In FIG. 3, reference symbol 1 designates a silicon semiconductor substrate. Provided on the silicon semiconductor substrate 1 are a silicon nitride layer 5, a silicon oxide layer 10 (e.g. borosilicate glass), a polysilicon layer 15, an antireflection layer 20 and also an overlying photoresist mask 25 with openings 50 for capacitor trenches DT to be formed.

During the etching of the capacitor trenches DT, the edge region RB of the silicon semiconductor substrate 1 (wafer substrate) that is not covered by the layer stack is protected from an etching attack by the plasma by a metallic shielding ring.

However, the plasma cannot be shut off digitally at the edge region by the shielding ring AR; rather there is a long-range interaction in the productive central region of the wafer. This results in the first instance due to the bending of the electric field lines F associated with the shielding ring AR, and also due to the disturbance of the flow dynamics at the edge of the shielding ring AR.

Incompletely opened holes in the polysilicon layer 15 obliquely etched holes or holes with a greatly reduced critical dimension are manifested as a result, to be precise primarily in the outer region of the wafer, where the field bending is the most pronounced.

The structures thus etched in the polysilicon layer 15 thus produce errors in the course of transferring structures into the underlying silicon oxide layer 10. These errors in the hard mask formed by the etched silicon oxide layer 10 then produce defective capacitor trenches during the etching of the silicon semiconductor substrate 1. This gives rise, on the one hand, to problems with increased defect density and, on the other hand, this effect can hugely disrupt the use of wet-chemical procedures for isotropically etching the capacitor trenches DT in order to enlarge the effective wall area, thus giving rise in turn to defect density problems or electrical failure.

The object on which the present invention is based is to avoid the formation of black silicon, during capacitor etching, to ensure better uniformity of the critical dimensions, and to exclude the phenomenon of mask erosion in the outermost edge region of the wafer.

According to the invention, this object is achieved by means of the fabrication method for a semiconductor structure as specified in Claim 1.

The present invention has the essential advantage that it is possible to significantly improve the selectivity during the patterning of the silicon hard mask by means of the photoresist mask through interposition of the oxide layer.

The idea on which the present invention is based consists in providing a thin masking layer made of silicon oxide above and laterally with respect to the second hard mask layer made of silicon and above an uncovered edge region of the semiconductor substrate.

The masking layer including an antireflection layer that is optionally used is preferably etched in one etching reactor, the edge region being covered by a shielding device, e.g. by a shielding ring. In this case, an etching chemistry that is highly selective with respect to silicon is expediently used. It can thus be ensured that all holes are completely transferred dimensionally faithfully into the masking layer made of silicon oxide. The field line effect outlined in the introduction is governed by geometry. The layer thickness plays the crucial part in this case. This effect can be disregarded when etching the thin masking layer made of silicon oxide of typically 25 nm.

The etching of the first and second hard mask layers made of silicon oxide and polysilicon, respectively, is then carried out in a reactor without a disturbing shielding device.

In particular, the masking layer made of silicon oxide serves as a hard mask during the patterning of the second hard mask layer made of silicon. If the removal of photoresist or an expansion of the critical dimension would be effected owing to a lack of selectivity with respect to the photoresist mask, the structure of the masking layer made of silicon oxide serves as a mask that determines the critical dimension.

Advantageous developments and improvements of the subject matter of the invention are found in the subclaims.

In accordance with one preferred development, the masking layer made of silicon oxide is provided by a deposition process.

In accordance with a further preferred development, the masking layer made of silicon oxide is provided by a thermal oxidation process.

In accordance with a further preferred development, the second hard mask layer is provided such that it is made of polysilicon.

In accordance with a further preferred development, the second hard mask layer is provided such that it is made of amorphous silicon.

In accordance with a further preferred development, a silicon nitride layer is provided between the semiconductor substrate and the first hard mask layer and is opened by a fifth plasma process using the opened first hard mask layer.

In accordance with a further preferred development, the first plasma process is highly selective with respect to silicon.

In accordance with a further preferred development, the first hard mask layer is fabricated from silane oxide.

A particular advantage results from the invention when using a first hard mask layer made of silane oxide. Experience with this material has shown that a thermal step is required for stability. This effect can be achieved for example by depositing a second hard mask layer made of polysilicon on the first hard mask layer made of silane oxide.

However, it is also perfectly conceivable to deposit amorphous silicon and to create the masking layer made of silicon oxide by means of a low-temperature step (e.g. wet thermal oxidation at typically 400° C.) below the phase transition (amorphous/crystalline) of silicon. This would have the additional advantage that the material properties of the first hard mask layer made of silane oxide could be obtained without the topography of polysilicon. Specifically, this would have the consequence that the thickness of an antireflection coating below the photoresist mask could be reduced from typically 80 nm to typically 40 nm, which signifies a significant relaxation of the photoresist budget in the case of minimum feature sizes of less than 100 nm.

Exemplary embodiments of the invention are illustrated in the drawings and are explained in more detail in the description below.

Figure 1A:
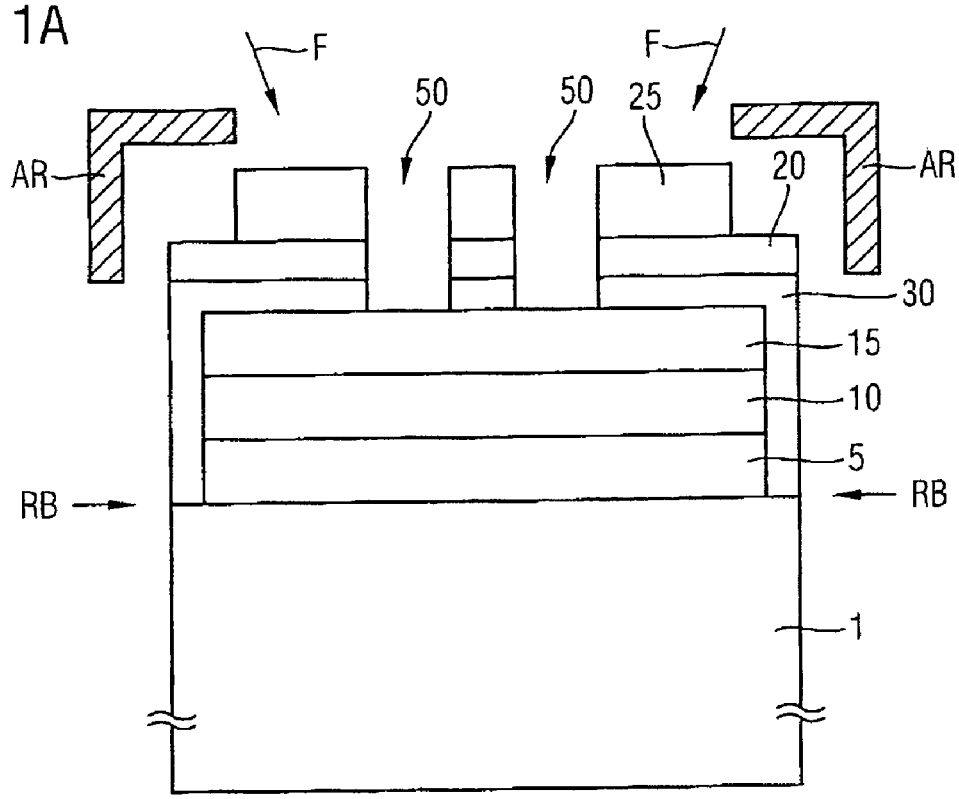

In the figures:

FIGS. 1a, b show schematic illustrations of successive stages in the fabrication method for elucidating a first embodiment of the present invention;

FIGS. 2a, b show schematic illustrations of successive stages in the fabrication method for elucidating a second embodiment of the present invention; and FIG. 3 shows a schematic illustration of an exemplary fabrication method for elucidating the problem area on which the present invention is based.

In the figures, identical reference symbols designate identical or functionally identical component parts.

FIGS. 1a, b are schematic illustrations of successive stages in the fabrication method for elucidating a first embodiment of the present invention.

In accordance with FIG. 1a, in contrast to the method described with reference to FIG. 3, after the provision of the layers 5 made of silicon nitride, 10 made of borosilicate glass (BSG) and 15 made of polysilicon, a silicon oxide layer 30 is deposited by means of a CVD method, which layer covers the second hard mask layer 15 made of polysilicon at its top side and laterally and also covers the edge region RB of the semiconductor substrate 1.

After the provision of the masking layer 30 made of silicon oxide, provision is made, as already explained in connection with FIG. 3, of an antireflection layer 20 and, above the latter, a photoresist mask 25 with openings 50 for the later trenches DT.

This is followed by a series of a plurality of plasma etching steps.

In a first plasma etching step, using the shielding ring AR already described, the antireflection layer 20 and the masking layer 30 made of silicon oxide are then etched highly selectively with respect to silicon using the photoresist mask 50, which leads to the structure shown in FIG. 1a.

Figure 1B:
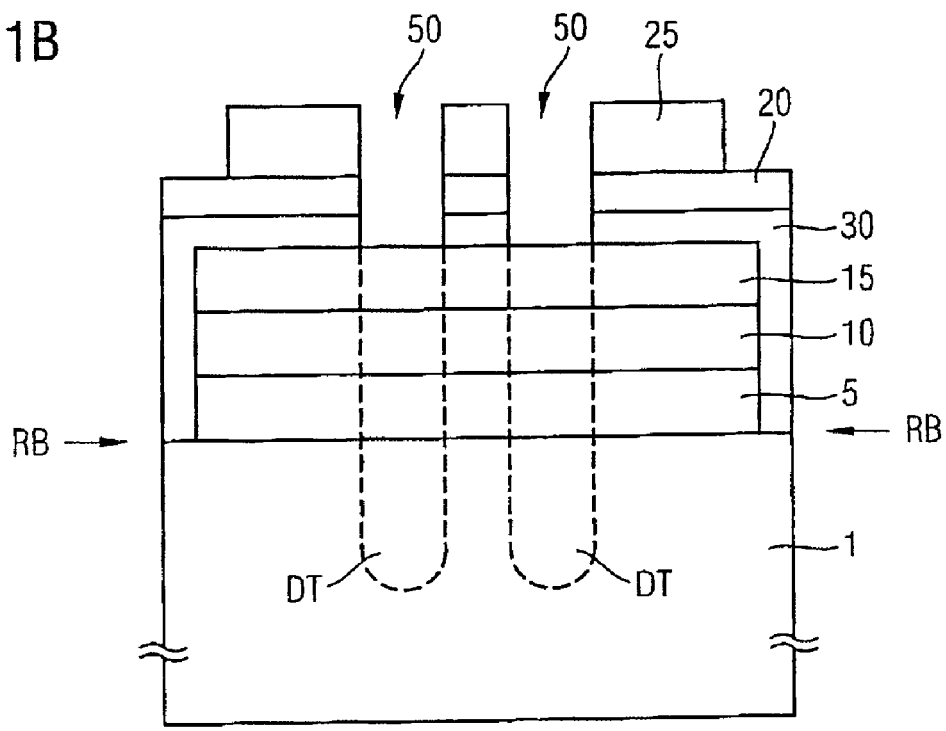

Referred further to FIG. 1b, further plasma etching steps are then carried out in order progressively to open the layers 15 made of polysilicon, 10 made of BSG glass and 5 made of silicon nitride and finally to form trenches DT in the semiconductor substrate 1 in a concluding etching step. This leads to the structure shown in FIG. 1b.

FIGS. 2a, b are schematic illustrations of successive stages in the fabrication method for elucidating a second embodiment of the present invention.

In the case of the second embodiment in accordance with FIG. 2, in contrast to the first embodiment, the masking layer 30' made of silicon oxide is not obtained by deposition, but rather by wet thermal oxidation at 400° C. In this embodiment, too, the second hard mask layer 15' is made of amorphous silicon and the first hard mask layer 10' is made of silane oxide.

In order to achieve the process state in accordance with FIG. 2b, in the first plasma process, the antireflection layer 20 and the masking layer 30 are etched highly selectively with respect to silicon, after which, as already described, the layers 15', 10' and 5 are opened and, finally, the trenches DT are formed in the semiconductor substrate 1.

Although the present invention has been described above on the basis of two preferred exemplary embodiments, it is not restricted thereto, but rather can be modified in diverse ways.

In particular, the invention can be used for arbitrary trench structures.

List of Reference Symbols

1 Semiconductor substrate
DT Trench
5 Silicon nitrate
10, 10' Silicon oxide layer
15 Polysilicon layer
15' Amorphus silicon layer
20 Antireflection layer
25 Photoresist mask
30, 30' Silicon oxide layer
AR Shielding ring
F Field line
RB Edge region
50 Mask opening

The invention claimed is:

1. Method for fabricating a semiconductor structure having the steps of:
   providing a semiconductor substrate (1) made of silicon with a first hard mask layer (10; 10') made of silicon oxide and an overlying second hard mask layer (15; 15') made of silicon;
   providing a masking layer (30; 30') made of silicon oxide above and laterally with respect to the second hard mask layer (15; 15') made of silicon and above an uncovered edge region (RB) of the semiconductor substrate (1);
   providing a photoresist mask (25) above the masking layer (30; 30') with openings corresponding from trenches (DT) to be formed in the semiconductor substrate (1);
   opening the masking layer (30; 30') in a first plasma process using the photoresist mask (25), the edge region (RB) being covered by a shielding device (AR);
   opening the first hard mask layer (10; 10') and second hard mask layer (15; 15') in a second and third plasma process; and
   forming the trenches (DT) in the semiconductor substrate (1) in a fourth plasma process using the opened first hard mask layer (10; 10');
   the edge region (RB) not being covered by the shielding device (AR) in the second to fourth plasma processes.

2. Method according to claim 1,
characterized
in that the masking layer (30) made of silicon oxide is provided by a deposition process.

3. Method according to claim 1,
characterized
in that the masking layer (30) made of silicon oxide is provided by a thermal oxidation process.

4. Method according to claim 1,
characterized
in that the second hard mask layer (15) is provided such that it is made of polysilicon.

5. Method according to claim 1,
characterized
in that the second hard mask layer (15') is provided such that it is made of amorphous silicon.

6. Method according to claim 1,
characterized
in that a silicon nitride layer (5) is provided between the semiconductor substrate (1) and the first hard mask layer (10; 10') and is opened by a fifth plasma process using the opened first hard mask layer (10; 10').

7. Method according to claim 1,
characterized
in that the first plasma process is highly selective with respect to silicon.

8. Method according to claim 1,
characterized
in that the first hard mask layer (10; 10') is fabricated from silane oxide.

* * * * *